United States Patent
Zeng et al.

(10) Patent No.: US 12,342,694 B2
(45) Date of Patent: Jun. 24, 2025

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Mian Zeng, Hubei (CN); Liang Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 548 days.

(21) Appl. No.: 17/789,550

(22) PCT Filed: Jun. 2, 2022

(86) PCT No.: PCT/CN2022/096877
§ 371 (c)(1),
(2) Date: Jun. 28, 2022

(87) PCT Pub. No.: WO2023/226076
PCT Pub. Date: Nov. 30, 2023

(65) Prior Publication Data
US 2023/0397459 A1    Dec. 7, 2023

(30) Foreign Application Priority Data
May 27, 2022    (CN) .......................... 202210591659.9

(51) Int. Cl.
*H10K 59/131*    (2023.01)
*G09G 3/3258*    (2016.01)
*H10K 59/121*    (2023.01)

(52) U.S. Cl.
CPC ......... *H10K 59/131* (2023.02); *G09G 3/3258* (2013.01); *H10K 59/1213* (2023.02);
(Continued)

(58) Field of Classification Search
None
See application file for complete search history.

(56) References Cited

U.S. PATENT DOCUMENTS

2016/0124491 A1    5/2016    An et al.
2019/0057664 A1*   2/2019    Shi .......................... G11C 19/28

FOREIGN PATENT DOCUMENTS

CN    103778896 A    5/2014
CN    106548748 A    3/2017
(Continued)

OTHER PUBLICATIONS

International Search Report in International application No. PCT/CN2022/096877, mailed on Dec. 21, 2022.
(Continued)

*Primary Examiner* — Kyoung Lee
(74) *Attorney, Agent, or Firm* — Rivka Friedman

(57) ABSTRACT

A display module and a display device are provided. A plurality of first scanning lines are electrically connected to a plurality of first gate driving circuits, a plurality of pixel driving circuits, and a reset module. The reset module outputs a first reset signal within a blanking interval, so that the plurality of bias signals transmitted by the plurality of data lines are applied to the plurality of first transistors through the second transistors in the plurality of pixel driving circuits. Therefore, the plurality of first transistors are turned on in the blanking interval at the same time to improve a flicker problem when the display module is driven at a low-frequency.

20 Claims, 7 Drawing Sheets

(52) U.S. Cl.
CPC ............... *G09G 2310/061* (2013.01); *G09G 2320/0247* (2013.01)

(56) References Cited

FOREIGN PATENT DOCUMENTS

| CN | 107452334 A | 12/2017 |
| CN | 108597441 A | 9/2018 |
| CN | 109410832 A | 3/2019 |
| CN | 109935212 A | 6/2019 |
| CN | 110148390 A | 8/2019 |
| CN | 111383594 A | 7/2020 |
| CN | 111429837 A | 7/2020 |
| CN | 111435587 A | 7/2020 |
| CN | 111754922 A | 10/2020 |
| CN | 111798789 A | 10/2020 |
| CN | 112201204 A | 1/2021 |
| CN | 212624745 U | 2/2021 |
| CN | 113140179 A | 7/2021 |
| CN | 113674668 A | 11/2021 |
| CN | 114120881 A | 3/2022 |
| CN | 114360441 A | 4/2022 |

OTHER PUBLICATIONS

Written Opinion of the International Search Authority in International application No. PCT/CN2022/096877, mailed on Dec. 21, 2022.

Chinese Office Action issued in corresponding Chinese Patent Application No. 202210591658.9 dated Mar. 9, 2023, pp. 1-9.

Chinese Office Action issued in corresponding Chinese Patent Application No. 202210591658.9 dated Jun. 6, 2023, pp. 1-8.

Chinese Office Action issued in corresponding Chinese Patent Application No. 202210591658.9 dated Aug. 28, 2023, pp. 1-9.

\* cited by examiner

DISPLAY MODULE AND DISPLAY DEVICE

FIELD OF INVENTION

The present application relates to a field of display technology, and in particular, to a display module and a display device.

BACKGROUND OF INVENTION

In order to improve a flicker problem that occurs when the display panel is driven at a low frequency, a transistor T3 and a transistor T4 in the pixel driving circuit shown in FIG. 1 are oxide transistors. However, when the display panel is driven at a very low frequency (such as 1 Hz), in addition to a flicker caused by the leakage of transistor T3 and transistor T4, a threshold voltage shift of the driving transistor T1 caused under a long-term bias action would also cause a current flowing through the light-emitting device to be changed, and aggravate the flicker problem.

SUMMARY OF INVENTION

Embodiments of the present application provide a display module and a display device, to improve the problem that when the display panel is driven at a low-frequency, the current flowing through the light-emitting device changes due to a threshold voltage shift of the first transistor under an action of bias for a long time, and aggravate flickering.

One embodiment of the present application provides a display module. The display module includes a display panel. The display panel includes a plurality of first scanning lines, a plurality of data lines, a plurality of cascaded first gate driving circuits, a plurality of pixel driving circuit, and a reset module.

Each of the pixel driving circuits includes a light-emitting device, a first transistor, and a second transistor. The first transistor and the light-emitting device are connected in series between the first voltage terminal and the second voltage terminal. A drain electrode of the second transistor is electrically connected to one of a source electrode or a drain electrode of the first transistor that is electrically connected to the first voltage terminal. A source electrode of the second transistor is electrically connected to a corresponding data line. An output terminal of the reset module is electrically connected to a plurality of first scanning lines. In a blanking interval, the reset module simultaneously transmits a first reset signal to the gate electrode of the second transistor in each of the pixel driving circuits through the plurality of first scanning lines, and wherein each of the second transistor in the pixel driving circuits transmits a bias signal transmitted by the data line to one of the source electrode and the drain electrode of the first transistor that is electrically connected to the data line according to the first reset signal.

Embodiments of the present application further provide a display device including any one of the above-mentioned display modules.

Compared with the prior art, the embodiments of the present application provide a display module and a display device. The display module includes a display panel. The display panel includes a plurality of first scanning lines, a plurality of data lines, a plurality of cascaded first gate driving circuit, a plurality of pixel driving circuits, and a reset module. In the display panel, the plurality of first scanning lines are electrically connected between the plurality of first gate driving circuits and the plurality of pixel driving circuits, and the plurality of first scanning lines are also electrically connected between the reset module and the plurality of pixel driving circuits. By using the reset module output the first reset signal in a blanking interval, the plurality of bias signals transmitted by the plurality of data lines are applied to the plurality of first transistors through the second transistors in the plurality of pixel driving circuits. Therefore, the plurality of first transistors are turned on in the blanking interval at the same time to improve the problem due to a threshold voltage shift of the first transistor under an action of bias for a long-term bias, the current flowing through the light-emitting device to be changed, which accentuate a flicker problem when the display panel is driven at a low frequency.

DETAILED DESCRIPTION OF EMBODIMENTS

In order to make the objectives, technical solutions and effects of the present application clearer and more specific, the present application will be further described in detail below with reference to the accompanying figures and examples. It should be understood that the specific embodiments described herein are only used to explain the present application, but not to limit the present application.

Figure 1:
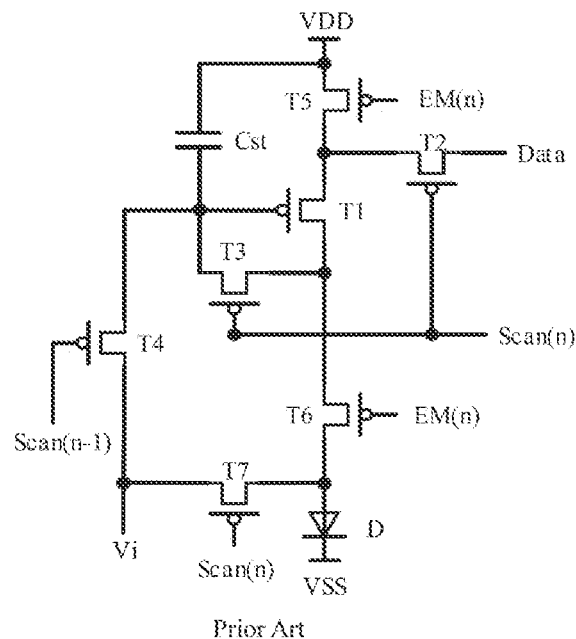
FIG. 1 is a schematic structural diagram of a pixel driving circuit in the prior art.
Figure 2:
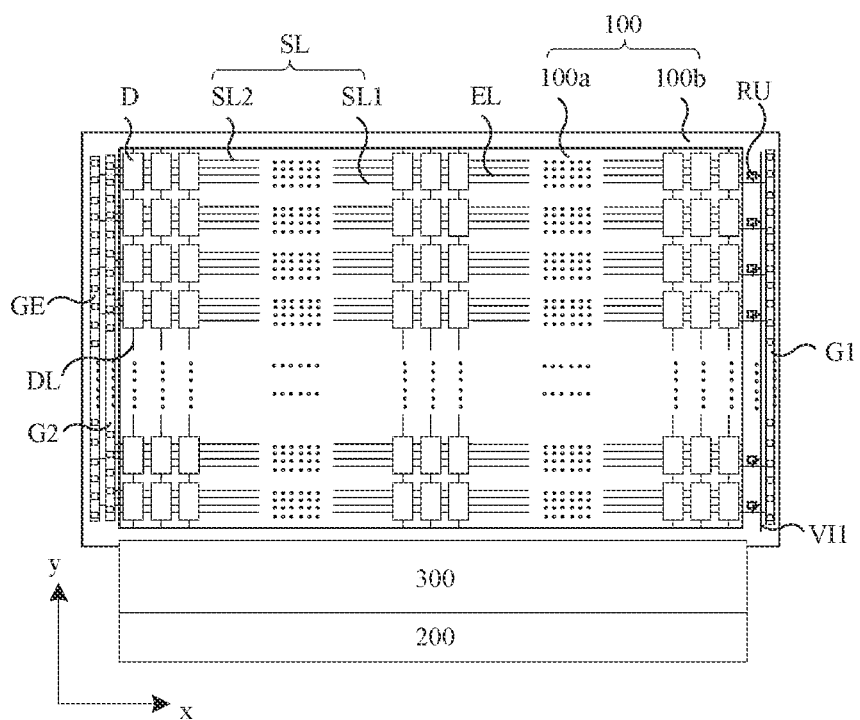
FIG. 2 is a schematic structural diagram of a display module provided by one embodiment of the present application.

Specifically, FIG. 2 is a schematic structural diagram of a display module provided by one embodiment of the present application. One embodiment of the present application provides a display module. The display module includes a display panel 100 and a driving chip 200.

The display panel 100 includes a display area 100*a* and a non-display area 100*b*. The display panel 100 implements a display function in the display area 100*a*. Optionally, the non-display area 100*b* is positioned at a periphery of the display area 100*a*. Optionally, the display panel 100 may further include a sensing area. The sensing area may be positioned in the display area 100*a* or in the non-display area 100*b*. The display panel 100 includes sensing elements disposed corresponding to the sensing regions. Optionally, the sensing element includes a camera, a fingerprint sensor, a distance sensor, and the like.

The display panel 100 includes a plurality of scanning lines SL, a plurality of data lines DL, a plurality of gate driving circuits, a plurality of pixel driving circuits, and a reset module.

A plurality of the data lines DL transmit a plurality of data signals. Optionally, a plurality of the data lines DL are arranged along a first direction x and extend along a second direction y in the display area 100a. The first direction x intersects with the second direction y.

A plurality of the scanning lines SL transmit a plurality of scanning signals. Optionally, a plurality of the scanning lines SL are arranged in the display area 100a along the second direction y and extend along the first direction x.

A plurality of the gate driving circuits are electrically connected to a plurality of the scanning lines SL for transmitting a plurality of the scanning signals to the plurality of the scanning lines SL. A plurality of the gate driving circuits are electrically connected between the driving chip 200 and a plurality of the scanning lines SL. Optionally, a plurality of the gate driving circuits are positioned in the non-display area 100b.

A plurality of the pixel driving circuits are electrically connected to a plurality of the scanning lines SL and a plurality of the data lines DL, so as to enable the display panel 100 to display according to the corresponding scanning signals and the data signals. Optionally, a plurality of the pixel driving circuits are positioned in the display area 100a. It can be understood that, in order to realize the display function of the display panel 100, each of the pixel driving circuits includes at least a first transistor T1 and a light-emitting device D. The first transistor T1 is configured to generate a driving current for driving the light-emitting device D to emit light according to the data signal, so that the light-emitting device D emits light. Optionally, the light-emitting device D includes an organic light-emitting diode, a sub-millimeter light-emitting diode, a miniature light-emitting diode, and the like. Optionally, the light-emitting layer of the light-emitting device includes quantum dot material.

The reset module is configured to apply a plurality of bias signals transmitted by a plurality of the data lines DL to a plurality of the first transistors T1 in a blanking interval, to turned on the first transistors T1 in the plurality of pixel driving circuits at the same time, to improve a problem that due to the threshold voltage shift of the first transistor T1 under the action of a long-term bias, the driving current flowing through the light-emitting device D to be changed to accentuate a flicker problem when the display panel is driven at a low frequency. Optionally, the reset module is electrically connected to the driving chip 200. Optionally, the reset module is electrically connected to the driving chip 200 through a first reset line VI1. Optionally, the reset module is positioned in the non-display area 100b.

Optionally, the blanking interval includes a vertical blanking interval and a horizontal blanking interval. Optionally, since the display panel includes a plurality of horizontal blanking intervals when displaying one frame image, the reset module can function within each horizontal blanking interval, or can function at several horizontal blanking intervals.

Further, the reset module is configured to apply a plurality of bias signals transmitted by a plurality of the data lines DL to a plurality of the first transistors T1 within the vertical blanking interval, so that the first transistors T1 of the plurality of pixel driving circuits are turned on at the same time to reduce power consumption while improving a flicker problem.

The driving chip 200 is electrically connected to the display panel 100 through the flexible circuit board 300, and the driving chip 200 outputs various control signals, so that the display panel 100 realizes display under the control of various control signals. Optionally, the driving chip 200 includes a display driver IC (DDIC).

Figure 3:
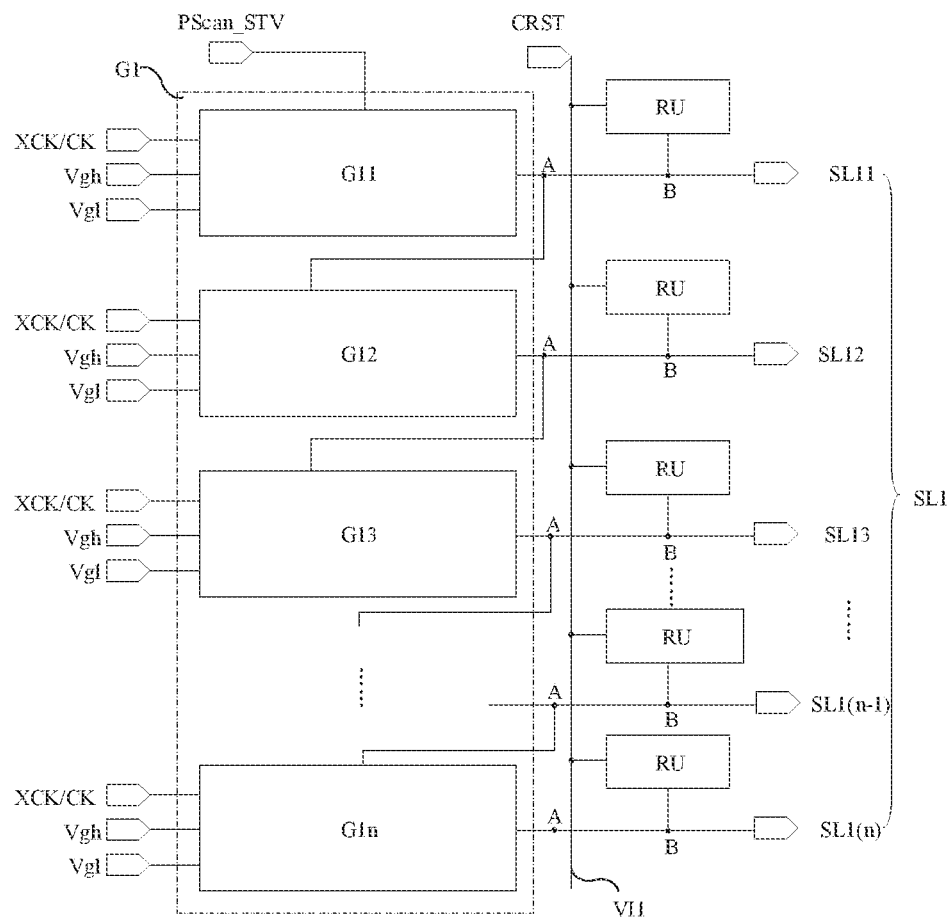
FIG. 3 is a schematic diagram of a connection structure of a first gate driving circuit, a reset module, and a first scanning line provided by one embodiment of the present application.

FIG. 3 is a schematic diagram of a connection structure of a first gate driving circuit, a reset module, and a first scanning line provided by one embodiment of the present application. The plurality of scanning lines SL include a plurality of first scanning lines SL1, wherein an output terminal of the reset module is electrically connected to the plurality of first scanning lines SL1, and wherein the reset module outputs a first reset signal RST to the plurality of first scanning lines SL1 within the blanking interval.

The plurality of gate driving circuits include a plurality of first gate driving circuits G1, and the plurality of the first gate driving circuits G1 output a plurality of first initial scanning signals according to the clock signals CK, XCK, and the power supply signals Vgh and Vgl. The output terminal of each of the first gate driving circuits G1 is electrically connected to each of the first scanning lines SL1.

The plurality of first scanning lines SL1 receive the first reset signal RST when the reset module outputs the first reset signal RST. The plurality of first scanning lines SL1 receive the plurality of first initial scanning signals when the plurality of first gate driving circuits G1 output a plurality of the first initial scanning signal. Therefore, the plurality of first scanning signals transmitted in the plurality of first scanning lines SL1 are composed of the plurality of the first initial scanning signals and the first reset signals.

Optionally, the reset module is electrically connected to the driving chip 200 through the first reset line VI1. The first reset signal RST can be directly provided by the driving chip 200, or the first reset signal RST is generated by the reset module according to the control signal CRST output by the driving chip 200.

Optionally, the reset module may include connecting lines electrically connected to the first reset line VI1 and the plurality of first scanning lines SL1 when the first reset signal RST is directly provided by the driving chip 200. During the blanking interval, the first reset signal RST is simultaneously transmitted to a plurality of the first scanning lines SL1 through the first reset line VI1 and the connecting lines, and the first reset signal RST is applied to a plurality of the pixel driving circuits through the plurality of the first scanning lines SL1.

Optionally, the reset module includes at least one reset unit RU when the first reset signal RST is generated by the reset module according to the control signal CRST output by the driving chip 200. The reset unit RU is electrically connected between the first reset line VI1 and the first scanning line SL1. The reset unit RU is configured to output the first reset signal RST according to the control signal CRST output by the driving chip 200. That is, each of the first scanning lines SL1 can be electrically connected to one of the reset units RU, or at least two of the first scanning lines SL1 can be electrically connected to one of the reset units RU.

Specifically, if the reset module includes a reset unit RU, the reset unit RU is electrically connected between the first reset line VI1 and a plurality of the first scanning lines SL1, so that a plurality of first scanning signals transmitted by the plurality of first scanning line SL1 are all affected by the reset unit RU, which can save layout space and manufacturing cost.

The reset module may also include a plurality of the reset units RU. Each of the reset units RU is electrically connected between the first reset line VI1 and each of the first scanning lines SL1, as shown in FIG. 3, so that a plurality of the first scanning signals transmitted by each of the first scanning lines SL1 are affected by a corresponding reset unit RU.

Figure 4:
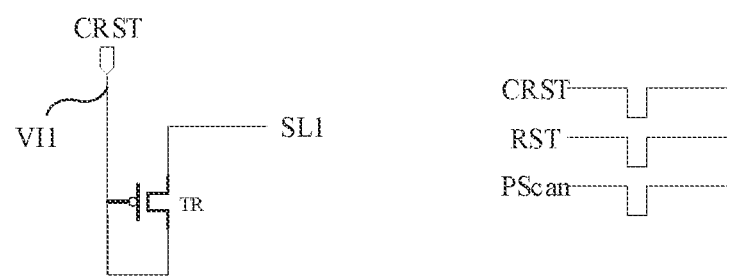
FIG. 4 is a schematic structural diagram and a time sequence diagram of a reset unit provided by one embodiment of the present application.

Optionally, the reset unit RU includes a reset transistor TR. Specifically, FIG. 4 is a schematic structural diagram and a time sequence diagram of a reset unit provided by one embodiment of the present application. PScan represents a first scanning signal output by the first scanning line SL1. A gate electrode of the reset transistor TR is electrically connected to the first reset line VI1, and one of a source electrode and a drain electrode of the reset transistor TR is electrically connected to the gate electrode of the reset transistor TR. The other of the source electrode and the drain electrode of the reset transistor TR is electrically connected to the first scanning line SL1. The reset transistor TR is configured to output the first reset signal RST according to the control signal CRST output by the driving chip 200.

Optionally, the reset transistor TR is a P-type transistor or an N-type transistor, and an active layer of the reset transistor TR includes a silicon semiconductor or an oxide semiconductor.

Optionally, a plurality of the first gate driving circuits G1 are arranged in cascade, as shown in FIG. 3. That is, a start-up signal of an $1^{st}$ stage first gate driving circuit G11 is PScan_STV, a start-up signal of an $n^{th}$ stage first gate driving circuit G1$n$ can be supplied by output signal of an n–$1^{th}$ stage first gate driving circuit G1 (n–1) or an n–$2^{th}$ stage first gate driving circuit G1($n$–2), where n is an integer and greater than 1.

Optionally, in order to avoid that the first reset signal RST output by the reset module is cascaded to the first gate driving circuit G1 causing a false output of the first gate driving circuit G1 when a plurality of the first gate driving circuits are designed in cascade. The display panel further includes an interlock module. The interlock module is electrically connected between a first node A and a second node B, or the interlock module is electrically connected between the first node A and an output terminal of the first gate driving circuit, or the interlock module is electrically connected between the second node B and the output terminal of the reset module. The interlock module is configured to block a path which the reset module transmits the first reset signal RST to the first gate driving circuit G1. The first node A is a connection point where the first gate driving circuit is electrically connected to a corresponding first scanning line SL1. The second node B is a connection point where the reset module is electrically connected to a corresponding first scanning line SL1.

Optionally, the interlocking module includes an interlocking transistor. A gate electrode of the interlocking transistor is electrically connected to the first reset line VI1. A source electrode and a drain electrode of the interlocking transistor are electrically connected between the first node A and the second node B, or the source electrode and the drain electrode of the interlock transistor are electrically connected between the first node A and the output terminal of the first gate driving circuit, or the source electrode and the drain electrode of the interlocking transistor are electrically connected between the second node B and the output terminal of the reset module. Further, the interlock transistor is one of an N-type transistor or a P-type transistor, and the reset transistor is another one of the P-type or N-type transistor. Further, when the reset module includes the connecting line, the interlocking transistor is one of the N-type transistor or the P-type transistor, and a transistor of the pixel driving circuit which is electrically connected to the first scanning line SL1 is another one of the N-type transistor or the P-type transistor, so as to ensure that a plurality of the pixel driving circuits do not interact with each other when responding to the output signals of the first gate driving circuit G1 and the reset module.

Figure 5:
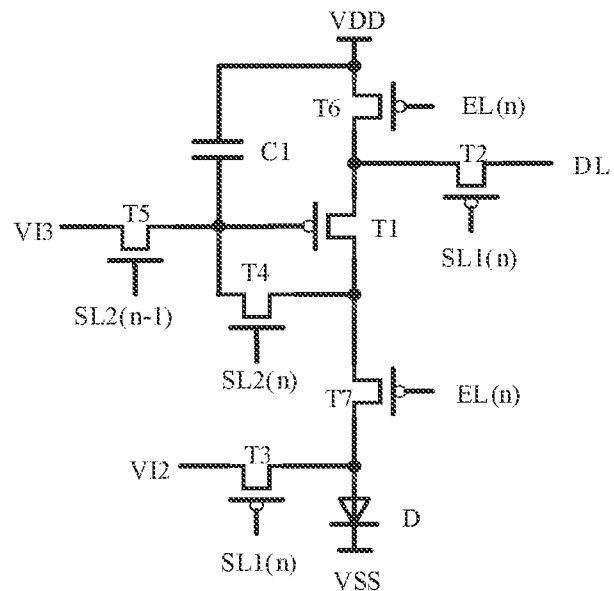
FIG. 5 is a schematic structural diagram of a pixel driving circuit provided by one embodiment of the present application.
Figure 6:
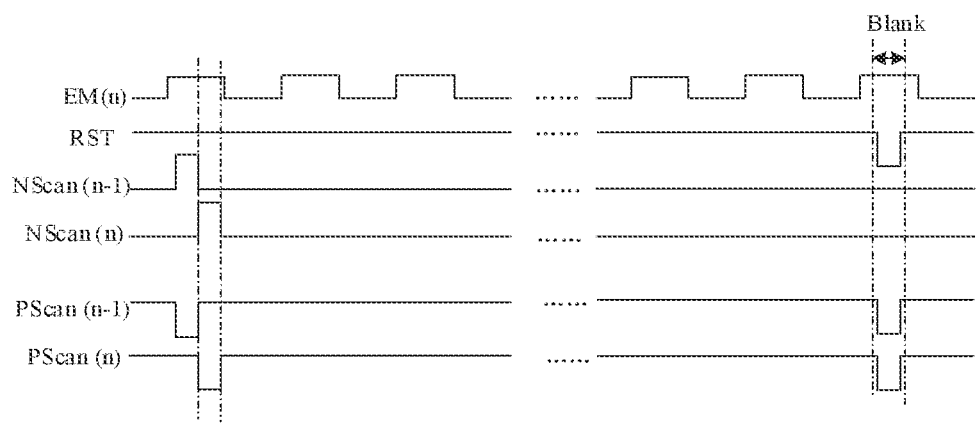
FIG. 6 is a time sequence diagram corresponding to the pixel driving circuit shown in FIG. 5 provided by one embodiment of the present application.

FIG. 5 is a schematic structural diagram of a pixel driving circuit provided by one embodiment of the present application. FIG. 6 is a time sequence diagram corresponding to the pixel driving circuit shown in FIG. 5 provided by one embodiment of the present application. The present application is described by taking a structure of the pixel driving circuit including seven transistors and one capacitor as an example. It can be understood that the pixel driving circuit is not actually limited to the form shown in FIG. 5. "Blank" represents the blanking interval.

Please continue to refer to FIG. 2, FIG. 3 and FIG. 5, each of the pixel driving circuits includes the first transistor T1, the second transistor T2, and at least one of the light-emitting devices D.

The first transistor T1 and the light-emitting device D are connected in series between the first voltage terminal VDD and the second voltage terminal VSS. Optionally, one of the source electrode or the drain electrode of the first transistor T1 is electrically connected to the first voltage terminal VDD, and the other one of the source electrode or the drain electrode of the first transistor T1 is electrically connected to an anode of the light-emitting device D. A cathode of the light-emitting device D is electrically connected to the second voltage terminal VSS.

The source electrode and the drain electrode of the second transistor T2 are electrically connected between the first transistor T1 and a corresponding data line DL, and the gate electrode of the second transistor T2 is electrically connected to a corresponding first gate driving circuit G1 through a corresponding first scanning line SL1. The second transistor T2 is configured to transmit data signals transmitted by a plurality of data lines to the first transistor T1 according to the first initial scanning signal output by a corresponding first gate driving circuit G1, to make the first transistor T1 generates a driving current for driving the light-emitting device D to emit light according to the data signal. The second transistor T2 is further configured to apply a plurality of bias signals transmitted by a plurality of the data lines to a plurality of the first transistors according to a first reset signal RST output by the reset module within the blanking interval. Therefore, the plurality of first transistors are turned on at the same time, to improve a problem that due to the threshold voltage shift of the first transistor T1 under an action of a long-term bias, the driving current flowing through the light-emitting device D be changed, which accentuate a flicker problem when the display panel is driven at a low frequency Optionally, the second transistor T2 is a P-type transistor or an N-type transistor. An active layer of the second transistor T2 includes a silicon semiconductor or an oxide semiconductor.

Optionally, one of the source electrode and the drain electrode of the second transistor T2 is electrically connected to the one of the source electrode or the drain electrode of the first transistor T1 that is electrically connected to the first voltage terminal VDD, or one of the source electrode or the drain electrode of the second transistor T2 is electrically connected to the one of the source electrode or the drain electrode of the first transistor T1 that is electrically connected to the anode of the light-emitting device D. The other one of the source electrode or the drain electrode of the two transistors T2 is electrically connected to a corresponding data line DL. In the present application, the source electrode of the second transistor T2 is electrically connected to a corresponding data line DL, and the drain electrode of the second transistor T2 is electrically connected to one of the source electrode or the drain electrode of the first transistor T1 that is electrically connected to the first voltage terminal VDD. The second transistor T2 is a P-type transistor as an example for description.

During the blanking interval, the reset module outputs the first reset signal RST to make the plurality of the first scanning signals are valid for the second transistors T2 in the plurality of pixel driving circuits. The plurality of the first scanning signals are simultaneously transmitted to the gate electrodes of the second transistors T2 in the plurality of pixel driving circuits through the plurality of the first scanning lines SL1, to make the plurality of the second transistors T2 are simultaneously turned on, a plurality of the bias signals transmitted by the plurality of the data lines DL are applied to the one of the source electrode or the drain electrode of the plurality of the first transistors T1 that is electrically connected to the data line DL, the plurality of first transistors T1 are biased and turned on at the same time, thereby shortening the biasing time of the first transistors T1 in the previous stage while compensating the threshold voltage bias of the first transistors T1. Therefore, a problem that due to the threshold voltage shift of the first transistor T1 under an action of a long-term bias, the driving current flowing through the light-emitting device D be changed, which accentuate a flicker problem can be improved. In particular, a problem of increasing flicker when the display panel is driven at a low frequency can be improved.

Optionally, a plurality of the offset signals transmitted by the plurality of the data lines DL may be the same or different. The voltage values of the plurality of the bias signals may be determined according to a hysteresis effect characteristic of a corresponding first transistor T1. Optionally, a voltage value of the bias signal may be less than or equal to the highest voltage VGMP of the positive grayscale voltages. Optionally, the bias signal is a DC voltage signal. An action time of the bias signal can be set according to actual requirements.

Please continue to refer to FIG. 5 to FIG. 6, each of the pixel driving circuits further includes a third transistor T3, a source electrode and a drain electrode of the third transistor T3 are electrically connected between the second reset line V12 and an anode of the light-emitting device D. A gate electrode of the third transistor T3 is electrically connected to a corresponding first scanning line SL1. The third transistor T3 is configured to apply the second reset signal transmitted by the second reset line V12 to the anode of the light-emitting device D according to a corresponding first scanning signal, and reset an anode voltage of the light-emitting device D.

Since the gate electrode of the third transistor T3 of each of the pixel driving circuits are electrically connected to a corresponding first scanning line SL1. Therefore, during the blanking interval, the reset module passes through a plurality of the first scanning line SL1 simultaneously transmits a first reset signal RST to the gate electrode of the third transistor T3 in each of the pixel driving circuits, so that the third transistor T3 in each of the pixel driving circuits also configured to apply a second reset signal transmitted by the second reset line V12 to the anodes of the plurality of light-emitting devices D according to the first reset signal RST, to make the anode voltages of the plurality of light-emitting devices D are reset within the blanking interval, so that the plurality of light-emitting devices D can have better display quality when emitting light.

Optionally, the gate electrode of the second transistor T2 and the gate electrode of the third transistor T3 may be electrically connected to the first scanning line SL1 at the same stage (for example, the gate electrode of the second transistor T2 and the gate electrode of the third transistor T3 are electrically connected to an $n^{th}$ stage first scanning line SL1($n$); or the gate electrode of the second transistor T2 and the gate electrode of the third transistor T3 are electrically connected to different stage first scanning line SL1 (For example, the gate electrode of the second transistor T2 is electrically connected to the n-$1^{th}$ stage first scanning line SL1($n-1$), the gate electrode of the third transistor T3 is electrically connected to an $n^{th}$ stage first scanning line SL1($n$)). n is an integer and greater than 1. The $n^{th}$ stage first scanning line SL1($n$) transmits an $n^{th}$ stage first scanning signal PScan(n).

Optionally, the third transistor T3 is a P-type transistor or an N-type transistor. An active layer of the third transistor T3 includes an oxide semiconductor or a silicon semiconductor.

It can be understood that the time when the first reset signal RST acts on the gate electrode of the third transistor T3 can be set according to actual requirements.

Please continue to refer to FIG. 2 and FIG. 5 to FIG. 6, in order to compensate the threshold voltage of the first transistor T1 and initialize the gate voltage of the first transistor T1, the pixel driving circuit further includes a fourth transistor T4 and a fifth transistor T5.

The source electrode and the drain electrode of the fourth transistor T4 are electrically connected between the gate electrode of the first transistor T1 and one of the source electrode or the drain electrode of the first transistor T1 that is electrically connected to the light-emitting device D. The fourth transistor T4 is configured to compensate the threshold voltage of the first transistor T1.

The source electrode and the drain electrode of the fifth transistor T5 are electrically connected between the third reset line VI3 and the gate electrode of the first transistor T1. The fifth transistor T5 is configured to transmit the third reset signal transmitted by the third reset line VI3 to the gate electrode of the first transistor T1 to initialize the gate voltage of the first transistor T1.

Since the first scanning signal includes information of the first reset signal RST, if the first scanning signal is used to control the turn-on and turn-off of the fourth transistor T4 and the fifth transistor T5, all the pixel driving circuit may not be able to accurately realize the display of the display panel 100. Therefore, the turn-on and turn-off control of the fourth transistor T4 and the fifth transistor T5 requires a corresponding gate driving circuit independently.

Specifically, please continue to refer to FIG. 2 and FIG. 5 to FIG. 6, the plurality of gate driving circuits further include a plurality of second gate driving circuits G2. The plurality of scanning lines SL further include a plurality of second scanning lines SL2. The plurality of second scanning lines SL2 transmit a plurality of second scanning signals. The plurality of the second gate driving circuits G2 are electrically connected to the plurality of the second scanning lines SL2.

The gate electrode of the fourth transistor T4 is electrically connected to a corresponding second scanning line SL2, so that the fourth transistor T4 compensates the threshold voltage of the first transistor T1 according to the corresponding second scanning signal. A gate electrode of the fifth transistor T5 is electrically connected to the corresponding second scanning line SL2, so that the fifth transistor T5 initializes the gate electrode of the first transistor T1 according to the corresponding second scanning signal.

In order to avoid mutual influence when compensating the threshold voltage of the first transistor T1 and initializing the first transistor T1, the gate electrode of the fourth transistor T4 and the gate electrode of the fifth transistor T5 are electrically connected to different stage scanning lines SL2. Optionally, the gate electrode of the fourth transistor T4 is electrically connected to an $n^{th}$ stage second scanning line SL2(n), and the gate electrode of the fifth transistor T5 is electrically connected to an $n-1^{th}$ stage second scanning line SL2(n-1). n is an integer and greater than 1. The $n-1^{th}$ stage second scanning line SL2(n-1) transmits an $n-1^{th}$ stage second scanning signal NScan(n-1). The $n^{th}$ stage second scanning line SL2(n) transmits an $n^{th}$ stage second scanning signal NScan(n).

In order to make the first transistor T1 can generate a driving current for driving the light-emitting device D to emit light according to the data signal transmitted by the data line DL, the fourth transistor T4 and the second transistor T2 need to be simultaneously turned on in a certain period of time. Therefore, when the second scanning signal transmitted by the second scanning line SL2 electrically connected to the fourth transistor T4 is valid, the first scan signal transmitted by the first scanning line SL1 electrically connected to the gate electrode of the second transistor T2 is also valid, so as to ensure a normal writing of the data signal transmitted by the data line DL.

Optionally, a plurality of the second gate driving circuits are arranged in cascade.

Optionally, the second scanning signal transmitted by each of the second scanning lines SL2 has a second frequency, wherein the second frequency is less than the first frequency. Optionally, the first frequency is an integer multiple of the second frequency. Optionally, the second frequency is 120 Hz, 60 Hz, 30 Hz, 24 Hz, 15 Hz, 1 Hz, and the like.

Optionally, the fourth transistor T4 and the fifth transistor T5 are P-type transistors or N-type transistors, and the active layers of the fourth transistor T4 and the fifth transistor T5 include oxide semiconductors or silicon semiconductors.

Further, the active layers of the fourth transistor T4 and the fifth transistor T5 include oxide semiconductors, so as to utilize the low leakage characteristics of oxide transistors compared with silicon transistors to reduce a leakage of the gate electrode of the first transistor T1 to the third reset line VI3 and one of the source electrode and the drain electrode of the first transistor T1. Further, since the P-type transistors whose active layers include oxide semiconductors are restricted by the current P-type oxide materials, a manufacturing of high-quality P-type transistors whose active layers include oxide semiconductors are also restricted. Therefore, based on the prior art, the fourth transistor T4 and the fifth transistor T5 are N-type transistors when the active layers of the fourth transistor T4 and the fifth transistor T5 include oxide semiconductors. However, it is not intended to limit the transistors whose active layers include oxide semiconductors in the present application to be N-type transistors, and the transistors whose active layers include oxide semiconductors in the present application can also be P-type transistors.

Please continue to refer to FIG. 2 and FIG. 5 to FIG. 6, the display panel further includes a plurality of light-emitting control lines EL and a plurality of light-emitting control driving circuits GE. A plurality of the light-emitting control driving circuits GE are electrically connected to a plurality of the light-emitting control lines EL. A plurality of the light-emitting control driving circuits GE output a plurality of light-emitting control signals. Optionally, a plurality of the light-emitting control driving circuits GE are positioned in the non-display area 100b. The plurality of the light-emitting control driving circuits GE are arranged in cascade.

The pixel driving circuit further includes a sixth transistor T6 and a seventh transistor T7.

A source electrode and a drain electrode of the sixth transistor T6 are electrically connected between the first voltage terminal VDD and one of the source electrode or the drain electrode of the first transistor T1. A source electrode and a drain electrode of the seventh transistor T7 are electrically connected between the anode of the light-emitting device D and the other one of the source electrode or the drain electrode of the first transistor T1. A gate electrode of the seventh transistor T7 and a gate electrode of the sixth transistor T6 is electrically connected to a corresponding light-emitting control line EL.

Optionally, the gate electrode of the seventh transistor T7 and the gate electrode of the sixth transistor T6 are electrically connected to a same level of the light-emitting control line EL (for example, the gate electrode of the seventh transistor T7 and the gate electrode of the sixth transistor T6 are electrically connected to an $n^{th}$ stage light-emitting control line EL(n)), or the gate electrode of the seventh transistor T7 and the gate electrode of sixth transistor T6 are electrically connected to different stages light-emitting control lines EL. The $n^{th}$ stage light-emitting control line EL(n) transmits an $n^{th}$ stage light-emitting control signal EM(n).

Optionally, the light-emitting control signal transmitted by each of the light-emitting control lines EL has a third frequency, wherein the first frequency is less than or equal to the third frequency.

Optionally, the third frequency is an integer multiple of the first frequency. Optionally, the third frequency can be 480 Hz, 360 Hz, 240 Hz, 120 Hz, 60 Hz, 30 Hz, 24 Hz, 15 Hz, 1 Hz, and the like.

Optionally, the sixth transistor T6 and the seventh transistor T7 are P-type transistors or N-type transistors, and the active layers of the sixth transistor T6 and the seventh transistor T7 include oxide semiconductors or silicon semiconductors.

In order to prevent the first reset signal RST from affecting the light-emitting state of the display panel, the reset signal RST is valid during an inactive period of the light-emitting control signal EM.

Please continue to refer to FIG. 5, the pixel driving circuit further includes a first capacitor C1. The first capacitor C1 is connected in series between the first voltage terminal VDD and the gate electrode of the first transistor T1.

Optionally, the pixel driving circuit further includes a second capacitor. The second capacitor is connected in series between the gate electrode of the first transistor T1 and the gate electrode of the second transistor T2.

It can be understood that a plurality of the gate driving circuits and the plurality of the light-emitting control driving circuits GE may adopt the currently circuit structure, and details are not described herein again.

FIG. 7A to FIG. 7F are driving time sequence diagrams corresponding to different image refresh frequencies provided by the embodiments of the present application. Since the reset module outputs the first reset signal RST in the blanking interval, the first frequency of the first reset signal RST is greater than or equal to the image refresh frequency of the display panel 100. Optionally, the image refresh frequency of the display panel 100 may be 120 Hz, 60 Hz, 120 Hz, 30 Hz, 24 Hz, 15 Hz, 1 Hz, or variable frequency.

Optionally, the first frequency is an integer multiple of the image refresh frequency, so that the first transistor T1 can achieve bias conduction in more frequency under the action of the first reset signal RST, thereby improving the shift of the threshold voltage of the first transistor T1 due to the hysteresis effect, and improving a flicker problem. Optionally, the first frequency can be 480 Hz, 360 Hz, 240 Hz, 120 Hz, 60 Hz, 30 Hz, 24 Hz, 15 Hz, 1 Hz, and the like.

The display panel includes a display frame DF and a reset frame RF during display when the first frequency is greater than the image refresh frequency. According to a difference between the first frequency and the image refresh frequency, numbers of the reset frames RF included in the two display frames DF are different. Specifically, if the first frequency is M times the image refresh frequency, a number ratio of the display frame DF to the reset frame RF is 1:(M−1).

Please continue to refer to FIG. 3, FIG. 5, FIG. 6, and FIGS. 7A to 7F, with the first transistor T1, the second transistor T2, the third transistor T3, the sixth transistor T6 and the seven transistors T7 are P-type transistors, the fourth transistor T4 and the fifth transistor T5 are N-type transistors, the gate electrode of the second transistor T2 and the gate electrode of the third transistor T3 are electrically connected to the $n^{th}$ stage first scanning line SL1($n$), the gate electrode of the fourth transistor T4 is electrically connected to the $n^{th}$ stage second scanning line SL2($n$), the gate electrode of the fifth transistor T5 is electrically connected to the n−$1^{th}$ stage second scanning line SL2($n$−1), the gate electrode of the sixth transistor and the gate electrode of the seventh transistor T7 are electrically connected to the $n^{th}$ stage light-emitting control line EL(n), the reset module outputs the first reset signal RST in the vertical blanking interval, and the third frequency is 480 Hz as an example, to explain the operating principle of the display module using different image refresh frequencies.

Specifically, please continue to refer to FIG. 3, FIG. 5, FIG. 6 and FIG. 7A, taking the image refresh frequency as 120 Hz as an example, a frequency of a start-up signal PScan_STV of an 1st stage first gate driving circuit G11 is also 120 Hz. If the first frequency is equal to the image refresh frequency, when the start-up signal PScan_STV of the 1st stage first gate driving circuit G11 is valid, the plurality of cascaded first gate driving circuits G1 sequentially output a plurality of the first initial scanning signals, the plurality of the first initial scanning signals are transmitted to a plurality of the pixel driving circuits through the plurality of the first scanning lines SL1, and the plurality of the pixel driving circuits control the corresponding light-emitting devices D to emit light according to the plurality of first initial scanning signal, the plurality of second scanning signals, and the plurality of the light-emitting control signal.

Specifically, the operating principle of the pixel driving circuit is described with the pixel driving circuit shown in FIG. 5 and the time sequence shown in FIG. 6. Each pixel driving circuit includes an initialization stage, a data writing and compensation stage, a light-emitting stage, and a biasing stage.

In the initialization stage: the fifth transistor T5 is turned on in response to an n−$1^{th}$ second scanning signal NScan (n−1) transmitted by an n−$1^{th}$ stage second scanning line SL2($n$−1), a third reset signal transmitted by the third reset line VI3 is transmitted to the gate electrode of the first transistor T1 to initialize a gate voltage of the first transistor T1.

In the data writing and compensation stage: the second transistor T2 and the third transistor T3 are turned on respond to the $n^{th}$ stage first scanning signal PScan(n) transmitted by the $n^{th}$ stage first scanning line SL1($n$), the fourth transistor T4 is turned on in response to the $n^{th}$ stage second scanning signal NScan(n) transmitted by the $n^{th}$ stage second scanning line SL2($n$), the data signal transmitted by the data line DL with the function of compensating the threshold voltage of the first transistor T1 is transmitted to the gate electrode of the first transistor T1 through the second transistor T2, the first transistor T1, and the fourth transistor T4. The capacitor C1 charges and maintains the gate voltage of the first transistor T1, the third transistor T3 transmits the second reset signal transmitted by the second reset line VI2 to the anode of the light-emitting device D, and initialized the anode voltage of the light-emitting device D.

In the light-emitting stage: the sixth transistor T6 and the seventh transistor T7 are turned on in response to the $n^{th}$ stage light-emitting control signal EM(n) transmitted by the $n^{th}$ light-emitting control line EL(n), the transistor T1 generates a driving current for driving the light-emitting device D to emit light according to the data signal.

In the biasing stage: the reset module outputs the first reset signal RST, the second transistors T2 and the third transistors T3 in the plurality of pixel driving circuits respond to a corresponding first scanning signal transmitted by the first scanning line SL1, causes the second transistors T2 and the third transistors T3 in the plurality of pixel driving circuits to be turned on at the same time, and the plurality of the data lines DL simultaneously transmit a plurality of the bias signal, to make the plurality of first transistors T1 turned on at the same time. The second reset signal transmitted by the second reset line VI2 is transmitted to the anodes of the light-emitting devices D through the third transistors T3 to initialize the anode voltage of the light-emitting devices D.

After that, the 1st stage start-up signal PScan_STV of the first gate driving circuit G11 is valid again, and a plurality of the pixel driving circuits go through the initialization stage, the data writing and compensation stage, the light-emitting stage, the biasing stage cycled in sequence to realize the display function of the display panel. In the present application, the full-screen reset of the display panel can be realized only through one of the first reset signals RST, and the full-screen reset of the display panel is hidden within the blanking interval, which can improve a flicker problem and reduce a power consumption of the display module.

Please continue to refer to FIG. 3, FIG. 5, FIG. 6, and FIGS. 7B to 7F, the first frequency may be greater than or equal to the image refresh frequency when the display module is driven in a variable frequency (Random). That is, it will use a higher frequency to refresh the image when the driving chip 200 detects the display content needs to be updated, and the driving chip 200 will gradually reduce the frequency of the first scanning signal and the second scanning signal when the display content unnecessary to be updated. Therefore, the display panel includes the display frame DF and the reset frame RF during display when the display module adopts the variable frequency driving or the first frequency is greater than the image refresh frequency.

Specifically, please continue to refer to FIG. 3, FIG. 5, FIG. 6, and FIGS. 7B to 7E. First, the display module is driven at a fixed frequency, and the first frequency is greater than the image refresh frequency as an example, to explain the operating principle of the display module.

Please continue to refer to FIG. 3, FIG. 5, FIG. 6 and FIG. 7B, with the image refresh frequency and a frequency of the start-up signal PScan_STV of the 1st stage first gate driving circuit G11 are 60 Hz, and the first frequency is 120 Hz as example. The first frequency is twice the image refresh frequency, and a ratio of the number of the display frame DF to the reset frame RF is 1:1. That is, one of the display frames DF is followed by one of the reset frames RF, one of the display frames DF immediately after the reset frame RF, and the display is performed cyclically in sequence.

In the display frame DF, when the start-up signal PScan_STV of the 1st stage first gate driving circuit G11 is valid, the plurality of cascaded first gate driving circuits G1 sequentially output a plurality of the first initial scanning signals, the plurality of the first initial scanning signals are transmitted to the plurality of the pixel driving circuits through the plurality of the first scanning lines SL1, and the plurality of the pixel driving circuits control corresponding light-emitting devices D to emit light according to a plurality of the first initial scan signals, a plurality of the second scanning signals, and a plurality of the light-emitting control signal EM. Each of the pixel drive circuits undergoes the initialization stage, the data writing and compensation stage, the light-emitting stage, and the biasing stage.

In the reset frame RF, since the start-up signal PScan_STV of the 1st stage first gate driving circuit G11 is invalid, the display panel maintains the display content of the display frame RF until the blanking interval. The second transistor T2 in the pixel driving circuit applies a plurality of the bias signals output by the plurality of data lines DL to the first transistor according to the first reset signal RST output by the reset module T1, to turn on the plurality of first transistors T1; at the same time, the second reset signal output by the second reset line VI2 is transmitted to the anodes of the plurality of light-emitting devices D through the third transistor T3, to initialize the anode voltage of light-emitting device D.

After that, entering the display frame DF, the start-up signal PScan_STV of the 1st stage first gate driving circuit G11 is valid again, and the plurality of pixel driving circuits go through the initialization stage, the data writing and compensation stage, the light-emitting stage, the biasing stage, and then enter the reset frame RF again, and cycle in turn.

Please continue to refer to FIG. 3, FIG. 5, FIG. 6 and FIG. 7C, with the image refresh frequency and the frequency of the start-up signal PScan_STV of the 1st stage first gate driving circuit G11 are 30 Hz, and the first frequency is 120 Hz as example. The first frequency is 4 times the image refresh frequency, and a ratio of the number of the display frame DF to the reset frame RF is 1:3. That is, one of the display frames DF is immediately followed by three of the reset frames RF, and then the reset frame RF is immediately followed by one of the display frames DF, and then three of the display frames RF are immediately followed by the display frame DF, and the display is performed cyclically in sequence.

Please continue to refer to FIG. 3, FIG. 5, FIG. 6 and FIG. 7D, with the image refresh frequency and the frequency of the start-up signal PScan_STV of the 1st stage first gate driving circuit G11 are 24 Hz, and the first frequency of 120 Hz as example. The first frequency is 5 times the image refresh frequency, and a ratio of the number of the display frame DF to the reset frame RF is 1:4. That is, one of the display frames DF is immediately followed by four of the reset frame RF, and then the reset frame RF is immediately followed by one display frame DF, and four reset frames RF are immediately followed by the display frame DF, and the display is performed cyclically in sequence.

Please continue to refer to FIG. 3, FIG. 5, FIG. 6 and FIG. 7E, when the image refresh frequency and the frequency of the start-up signal PScan_STV of the 1st stage first gate driving circuit G11 are 15 Hz, and the first frequency is 120 Hz as example. The first frequency is 8 times the image refresh frequency, and a ratio of the number of the display frame DF to the reset frame RF is 1:7. That is, one display frame DF is followed by seven reset frames RF, and then seven reset frames RF are immediately followed by one display frame DF, and then seven reset frames RF are immediately followed by the display frame DF, and the display is performed cyclically in sequence.

Please continue to refer to FIG. 3, FIG. 5, FIG. 6 and FIG. 7F, when the display module is driven in a variable frequency (Random), if the driving chip 200 detects that the display content needs to be updated, the driving chip 200 output the start-up signal PScan_STV to the $1^{st}$ stage first gate driving circuit G11, so that a display stage of the display panel enters the display frame DF; when the driving chip 200 detects that the display content unnecessary to be updated, the driving chip 200 will gradually reduce the frequency of the start-up signal PScan_STV output to the 1st stage first gate driving circuit G11, and gradually reduce the frequency of the start-up signal output to an $1^{st}$ stage second gate driving circuit, so that he frequencies of the first initial scanning signal output by the first gate driving circuit and the second scanning signal output by the second gate driving circuit are gradually reduced, so that unequal number of the reset frames RF are inserted between two adjacent display frames DF.

Figure 7A:
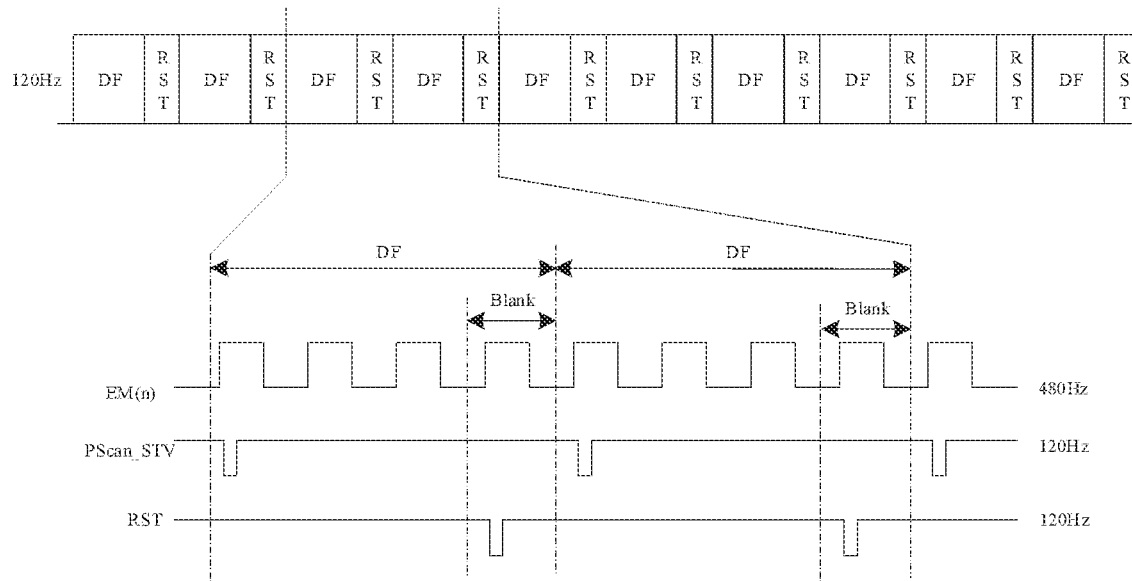
FIG. 7A to FIG. 7F are driving time sequence diagrams corresponding to different image refresh frequencies provided by embodiments of the present application.
Figure 7B:
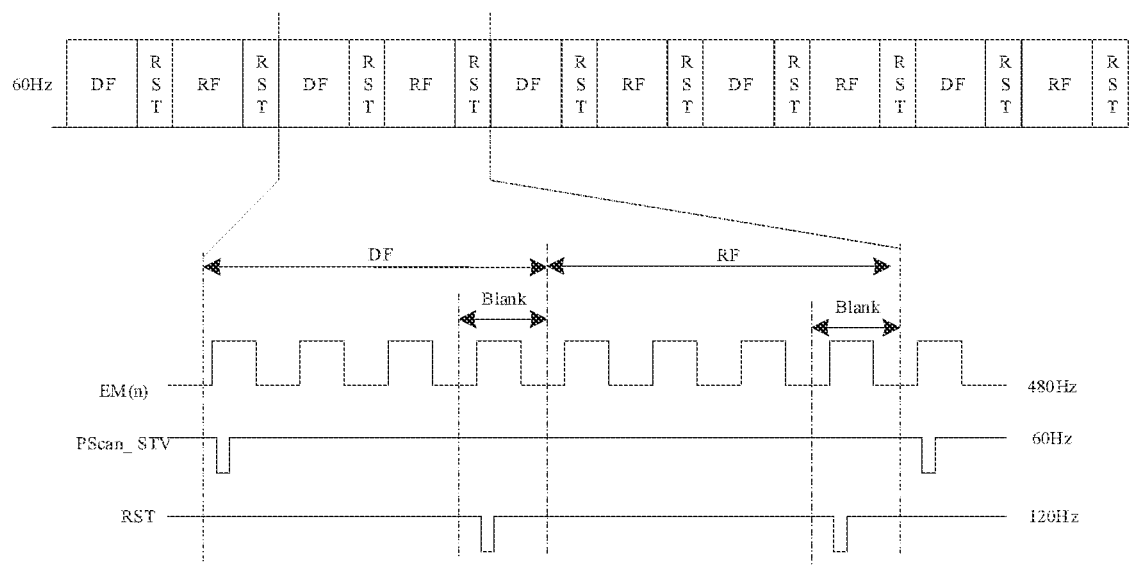
Figure 7C:
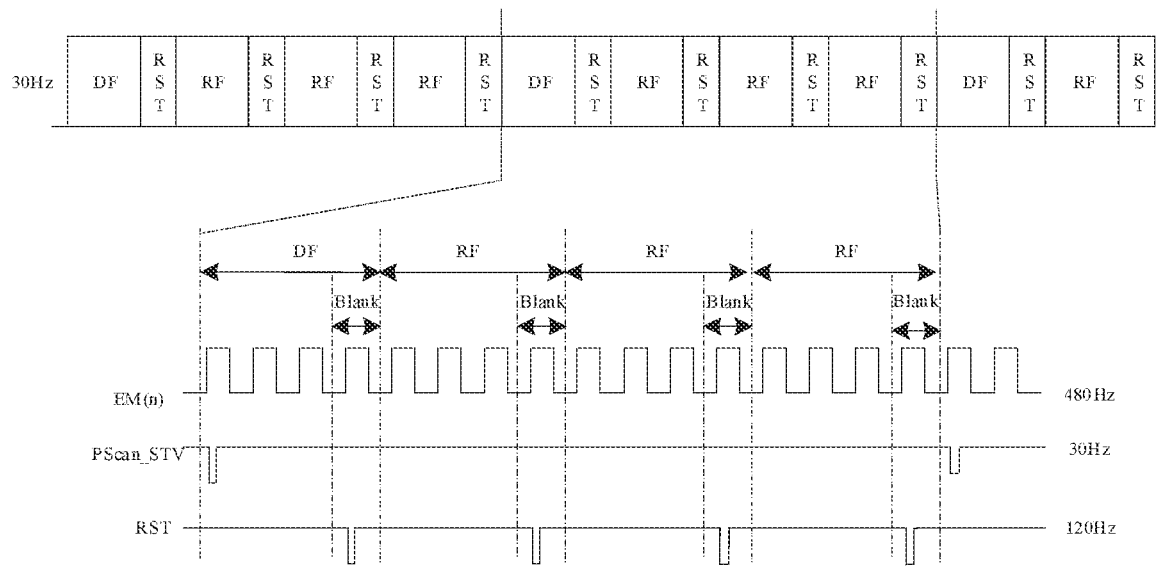
Figure 7D:
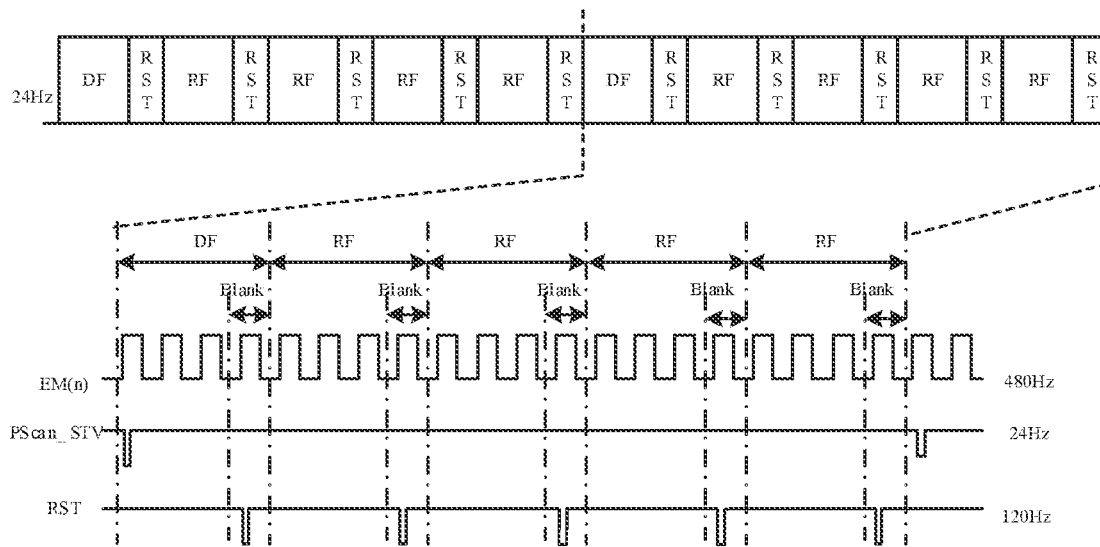
Figure 7E:
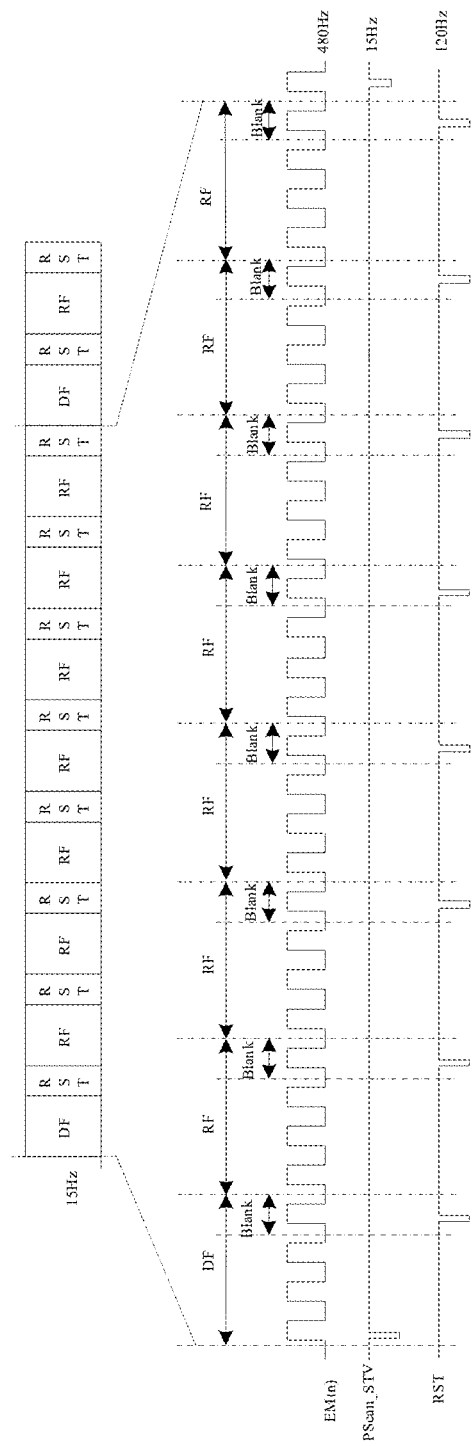
Figure 7F:
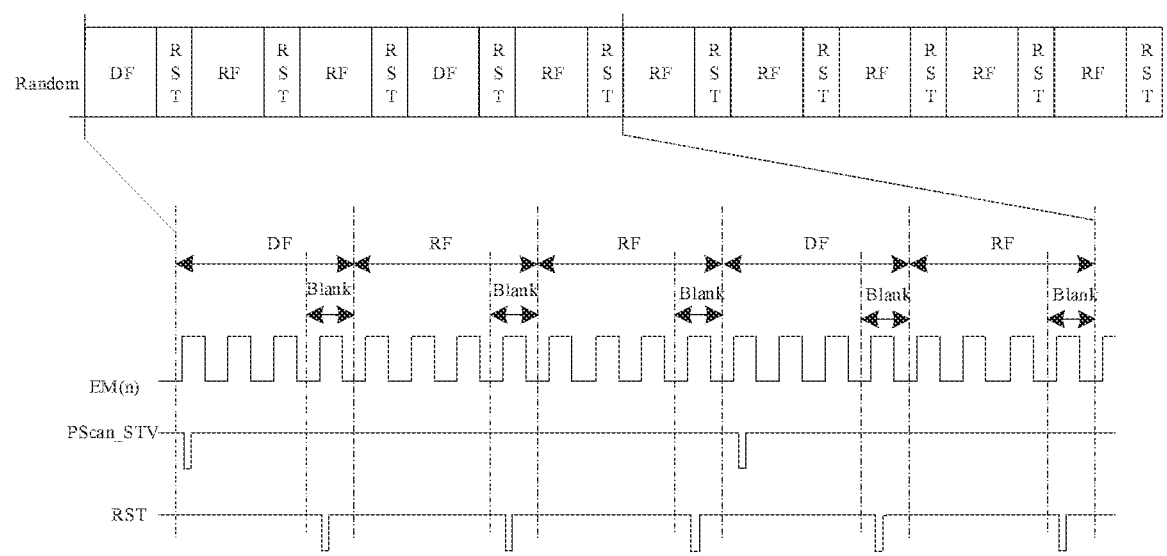

An operating principle of the display frame DF and the reset frame RF is similar to the operating principle corresponding to the driving frequency shown in FIG. 7B when the display module adopts the driving frequency corresponding to FIG. 7C to FIG. 7F, and will not be repeated here. FIG. 7A to FIG. 7F are all described by taking the blanking interval as a vertical blanking interval as an example, when the blanking interval is a horizontal blanking interval, the operating principle of the display module is similar to the operating principle when the blanking interval is a vertical blanking interval, and will not be repeated here.

It can be understood that the display panel further includes polarizers, touch electrodes and other parts not shown.

It can be understood that, in some embodiments, the display panel includes a backlight driving circuit. The backlight driving circuit includes the first transistor T1 and the light-emitting device D. The backlight driving circuit can improve the threshold voltage shift of the first transistor T1 under a long-time bias action through the reset module.

The present application further provides a display device comprising any of the above-mentioned display panels or any of the above-mentioned display modules.

Understandably, the display device includes a movable display device such as a notebook computer, a mobile phone, etc., a fixed terminal such as a desktop computer, a TV, etc., a measurement device such as a sports bracelet, a thermometer, etc., and the like.

Specific examples are used herein to explain the principles and implementations of the present application. The descriptions of the above embodiments are only used to help understand the methods and core ideas of the present application, and the contents of this specification should not be construed as limitations on the present application.

What is claimed is:
1. A display module, comprising a display panel, wherein the display panel comprises:
   a plurality of first scanning lines;
   a plurality of data lines;
   a plurality of cascaded first gate driving circuits;

a plurality of pixel driving circuits, wherein each of the pixel driving circuits comprises a light-emitting device, a first transistor, and a second transistor, wherein the first transistor and the light-emitting device are connected in series between a first voltage terminal and a second voltage terminal, wherein a drain electrode of the second transistor is electrically connected to one of a source electrode or a drain electrode of the first transistor that is electrically connected to the first voltage terminal, and wherein a source electrode of the second transistor is electrically connected to a corresponding data line; and a reset module, wherein an output terminal of the reset module is electrically connected to the plurality of first scanning lines;

wherein in a blanking interval, the reset module simultaneously transmits a first reset signal to the gate electrode of the second transistor in each of the pixel driving circuits through the plurality of first scanning lines, and wherein each of the second transistor in the pixel driving circuits transmits a bias signal transmitted by the data line to one of the source electrode and the drain electrode of the first transistor that is electrically connected to the data line according to the first reset signal.

2. The display module according to claim 1, wherein the pixel driving circuit further comprises:

a third transistor, wherein a source electrode and a drain electrode of the third transistor are electrically connected between a second reset line and an anode of the light-emitting device, and wherein a gate electrode of the third transistor is electrically connected to a corresponding first scanning line;

wherein during the blanking interval, the reset module simultaneously transmits the first reset signal to the gate electrode of the third transistor in each of the pixel driving circuits through the plurality of first scanning lines, and wherein each of the third transistor in the pixel driving circuits transmits a second reset signal transmitted by the second reset line to the anodes of the plurality of light-emitting devices according to the first reset signal.

3. The display module according to claim 1, wherein the display module further comprises:

a driving chip, wherein a plurality of the first gate driving circuits and the reset module are electrically connected between the driving chip and a plurality of the first scanning lines.

4. The display module according to claim 3, wherein the reset module further comprises:

a plurality of reset units, wherein each reset unit is electrically connected between a first reset line and each of the first scanning lines, and wherein the first reset line is electrically connected between the reset unit and the driving chip.

5. The display module according to claim 4, wherein the reset unit comprises a reset transistor, wherein a gate electrode of the reset transistor is electrically connected to the first reset line, and wherein one of a source electrode and a drain electrode of the reset transistor is electrically connected to a gate electrode of the reset transistor, and wherein the other one of the source electrode and the drain electrode of the reset transistor is electrically connected to the first scanning line.

6. The display module according to claim 1, wherein the blanking interval is a vertical blanking interval.

7. The display module according to claim 1, wherein the first reset signal has a first frequency, and wherein the first frequency is greater than or equal to an image refresh frequency of the display panel.

8. The display module according to claim 7, wherein the display panel further comprises a plurality of second scanning lines and a plurality of cascaded second gate driving circuits, wherein a plurality of the second gate driving circuits electrically connected with a plurality of the second scanning lines, and wherein each of the pixel driving circuits further comprises:

a fourth transistor, wherein a source electrode and a drain electrode of the fourth transistor are electrically connected between a gate electrode of the first transistor and one of the source electrode or the drain electrode of the first transistor that is electrically connected to the light-emitting devices, and wherein a gate electrode of the fourth transistor is electrically connected to a corresponding second scanning line; and a fifth transistor, wherein a source electrode and a drain electrode of the fifth transistor are electrically connected between a third reset line and the gate electrode of the first transistor, and wherein a gate electrode of the fifth transistor is electrically connected to a corresponding second scanning line;

wherein a second scanning signal transmitted by each of the second scanning lines has a second frequency, and wherein the second frequency is less than the first frequency.

9. The display module according to claim 8, wherein the display panel further comprises: a plurality of light-emitting control lines and a plurality of cascaded light-emitting control driving circuits, wherein a plurality of the light-emitting control driving circuits are electrically connected to a plurality of the light-emitting control lines, and wherein each of the pixel driving circuits further comprises:

a sixth transistor, wherein a source electrode and a drain electrode of the sixth transistor are electrically connected between the first voltage terminal and one of the source electrode or the drain electrode of the first transistor; and a seventh transistor, wherein a source electrode and a drain electrode of the seventh transistor are electrically connected between the anode of the light-emitting device and the other one of the source electrode or the drain electrode of the first transistor, and wherein a gate electrode of the seventh transistor and a gate electrode of the sixth transistor are electrically connected to a corresponding light-emitting control line;

wherein the light-emitting control signal transmitted by each of the light-emitting control lines has a third frequency, and wherein the first frequency is less than the third frequency.

10. The display module according to claim 9, wherein the first frequency is an integer multiple of the image refresh frequency and the second frequency, and wherein the third frequency is an integer multiple of the first frequency.

11. A display device, comprising a display module, wherein the display module comprises a display panel, and wherein the display panel comprises:

a plurality of first scanning lines;
a plurality of data lines;
a plurality of cascaded first gate driving circuits;
a plurality of pixel driving circuits, wherein each of the pixel driving circuits comprises a light-emitting device, a first transistor, and a second transistor, wherein the first transistor and the light-emitting device are connected in series between a first voltage terminal and a second voltage terminal, wherein a drain electrode of the second transistor is electrically connected to one of a source electrode or a drain electrode of the first transistor that is electrically connected to the first voltage terminal, and wherein a source electrode of the second transistor is electrically connected to a corresponding data line; and a reset module, wherein an output terminal of the reset module is electrically connected to the plurality of first scanning lines;

wherein in a blanking interval, the reset module simultaneously transmits a first reset signal to the gate electrode of the second transistor in each of the pixel driving circuits through the plurality of first scanning lines, and wherein each of the second transistor in the pixel driving circuits transmits a bias signal transmitted by the data line to one of the source electrode and the drain electrode of the first transistor that is electrically connected to the data line according to the first reset signal.

12. The display device according to claim 11, wherein the pixel driving circuit further comprises:

a third transistor, wherein a source electrode and a drain electrode of the third transistor are electrically connected between a second reset line and an anode of the light-emitting device, and wherein a gate electrode of the third transistor is electrically connected to a corresponding first scanning line;

wherein during the blanking interval, the reset module simultaneously transmits the first reset signal to the gate electrode of the third transistor in each of the pixel driving circuits through the plurality of first scanning lines, and wherein each of the third transistor in the pixel driving circuits transmits a second reset signal transmitted by the second reset line to the anodes of the plurality of light-emitting devices according to the first reset signal.

13. The display device according to claim 11, wherein the display module further comprises:

a driving chip, wherein a plurality of the first gate driving circuits and the reset module are electrically connected between the driving chip and a plurality of the first scanning lines.

14. The display device according to claim 13, wherein the reset module further comprises:

a plurality of reset units, wherein each reset unit is electrically connected between a first reset line and each of the first scanning lines, and wherein the first reset line is electrically connected between the reset unit and the driving chip.

15. The display device according to claim 14, wherein the reset unit comprises a reset transistor, wherein a gate electrode of the reset transistor is electrically connected to the first reset line, and wherein one of a source electrode and a drain electrode of the reset transistor is electrically connected to a gate electrode of the reset transistor, and wherein the other one of the source electrode and the drain electrode of the reset transistor is electrically connected to the first scanning line.

16. The display device according to claim 11, wherein the blanking interval is a vertical blanking interval.

17. The display device according to claim 11, the first reset signal has a first frequency, and wherein the first frequency is greater than or equal to an image refresh frequency of the display panel.

18. The display device according to claim 17, wherein the display panel further comprises a plurality of second scanning lines and a plurality of cascaded second gate driving circuits, wherein a plurality of the second gate driving circuits electrically connected with a plurality of the second scanning lines, and wherein each of the pixel driving circuits further comprises:

a fourth transistor, wherein a source electrode and a drain electrode of the fourth transistor are electrically connected between a gate electrode of the first transistor and one of the source electrode or the drain electrode of the first transistor that is electrically connected to the light-emitting devices, and wherein a gate electrode of the fourth transistor is electrically connected to a corresponding second scanning line; and a fifth transistor, wherein a source electrode and a drain electrode of the fifth transistor are electrically connected between a third reset line and the gate electrode of the first transistor, and wherein a gate electrode of the fifth transistor is electrically connected to a corresponding second scanning line;

wherein a second scanning signal transmitted by each of the second scanning lines has a second frequency, and wherein the second frequency is less than the first frequency.

19. The display device according to claim 18, wherein the display panel further comprises: a plurality of light-emitting control lines and a plurality of cascaded light-emitting control driving circuits, wherein a plurality of the light-emitting control driving circuits are electrically connected to a plurality of the light-emitting control lines, and wherein each of the pixel driving circuits further comprises:

a sixth transistor, wherein a source electrode and a drain electrode of the sixth transistor are electrically connected between the first voltage terminal and one of the source electrode or the drain electrode of the first transistor; and a seventh transistor, wherein a source electrode and a drain electrode of the seventh transistor are electrically connected between the anode of the light-emitting device and the other one of the source electrode or the drain electrode of the first transistor, and wherein a gate electrode of the seventh transistor and a gate electrode of the sixth transistor are electrically connected to a corresponding light-emitting control line;

wherein the light-emitting control signal transmitted by each of the light-emitting control lines has a third frequency, and wherein the first frequency is less than the third frequency.

20. The display device according to claim 19, wherein the first frequency is an integer multiple of the image refresh frequency and the second frequency, and wherein the third frequency is an integer multiple of the first frequency.

* * * * *